June 22, 1965 P. K. WEIMER 3,191,061
INSULATED GATE FIELD EFFECT DEVICES AND ELECTRICAL CIRCUITS EMPLOYING SUCH DEVICES
Filed May 31, 1962 6 Sheets-Sheet 1

INVENTOR.
PAUL K. WEIMER
BY John V. Regan
ATTORNEY

INVENTOR.
PAUL K. WEIMER
BY John V. Regan
ATTORNEY

June 22, 1965 P. K. WEIMER 3,191,061

INSULATED GATE FIELD EFFECT DEVICES AND ELECTRICAL CIRCUITS EMPLOYING SUCH DEVICES

Filed May 31, 1962 6 Sheets-Sheet 3

INVENTOR.
PAUL K. WEIMER
BY John V. Regan
ATTORNEY

INVENTOR.
PAUL K. WEIMER
BY John V. Regan
ATTORNEY

INVENTOR.
PAUL K. WEIMER
BY John V. Regan
ATTORNEY

INVENTOR.
PAUL K. WEIMER
BY John V. Regan
ATTORNEY 3,191,061

INSULATED GATE FIELD EFFECT DEVICES AND ELECTRICAL CIRCUITS EMPLOYING SUCH DEVICES

Paul K. Weimer, Princeton, N.J., assignor to Radio Corporation of America, a corporation of Delaware Filed May 31, 1962, Ser. No. 198,923
26 Claims. (Cl. 307—88.5)

This invention relates to electrical circuits and, in particular, to bistable circuit arrangements which use thin film, solid state electrical devices as the active elements.

Bistable multivibrators, or flip-flops, find wide use in digital computers and other apparatus as information storage elements in shift registers, counters and memories, and as control devices and the like. Generally speaking, a flip-flop may include two amplifying devices having their control and output electrodes cross-coupled by means of suitable coupling impedances, and bias means connected to the control electrodes for biasing one device in the "off" state while the other device is concurrently in the "on" state. It is desirable in the interests of reduced space, weight and power dissipation, as well as increased reliability and economy, to simplify the circuit as much as possible by reducing the number of component parts and by fabricating the circuit as an integrated structure.

Accordingly it is among the objects of this invention to provide:

A flip-flop in which the control and output electrodes may be directly cross-coupled, thereby eliminating the usual cross-coupling impedance elements;

A flip-flop which does not require separate bias means for the control electrodes;

A flip-flop in which the control electrodes draw little or no current, regardless of the magnitude and polarity of the biases thereon;

An integrated, solid state flip-flop which can be prepared entirely by deposition of thin films upon an insulating substrate or support;

An integrated, solid state flip-flop in which conduction is by majority carriers; and Integrated circuits, such as shift registers, which employ flip-flops of the type described.

A still further object of the invention is to provide a novel flip-flop which draws little or, for practical purposes, on current in either stable state.

A flip-flop structure according to the invention comprises first and second devices each having a layer of semi-conductive material, and first and second spaced electrodes on the layer. The second electrode serves as an output electrode. A third, or control, electrode extends over at least a portion of the space between the first and second electrodes and is separated from the semiconductive layer by a region of insulating material. Each second electrode is conected to the control electrode of the other device.

One feature of the invention is that the second electrode of one device and the control electrode of the other device may be different portions of a single, continuous electrode.

Another feature of the invention is that the flip-flop structure may consist of four strip electrodes deposited on a layer of semiconductive material, certain portions of selected strips being separated from the layer of semiconductive material by regions of insulating material.

In the accompanying drawing, like reference characters denote like components, and:

FIGURE 1 is an energy level diagram useful in explaining the nature of an insulating contact in a thin film triode;

FIGURES 2(*a*) and 2(*b*) are, respectively, a plan view of one flip-flop structure according to the invention and an equivalent circuit diagram of the flip-flop;

FIGURES 3 and 4 are sectional views taken along the lines 3—3 and 4—4, respectively, of FIGURE 2(*a*);

FIGURE 5 is a set of typical characteristic curves for a thin film triode;

FIGURES 6(*a*) and 6(*b*) are, respectively, a plan view of another flip-flop structure according to the invention, and an equivalent circuit diagram of the flip-flop;

FIGURE 8 is a partial plan view of a shift register structure according to the invention;

FIGURE 9 is an equivalent circuit diagram of the shift register of FIGURE 8;

FIGURES 10–13 are views of certain electrical components which may be fabricated by thin film techinques;

Figure 15B:
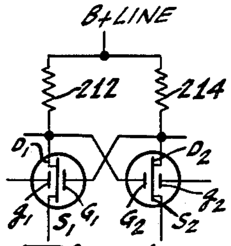
Figures 15A, 16, 17, 18:
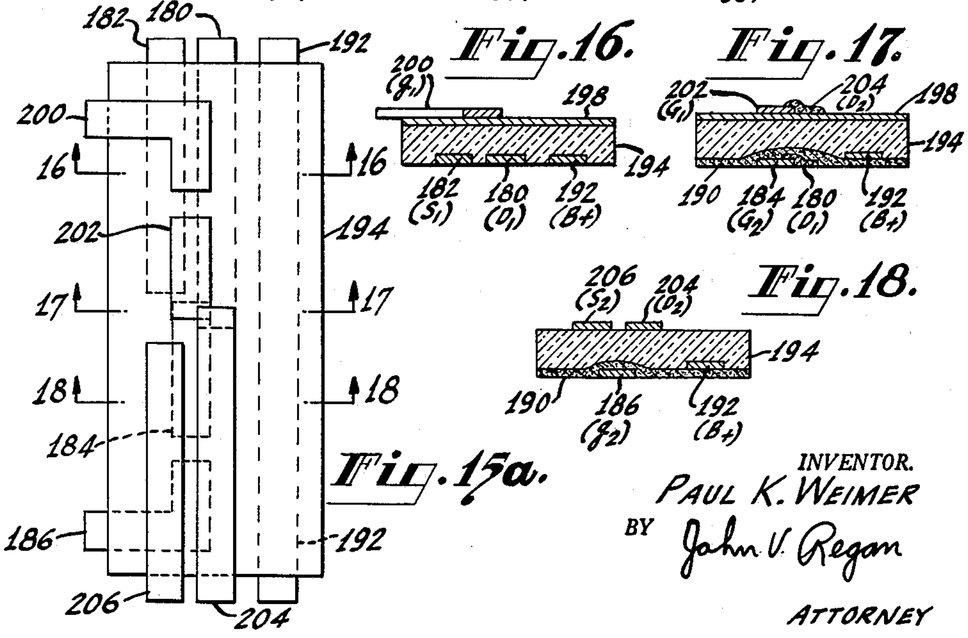
Figures 19A, 19B, 20, 21, 22, 23:
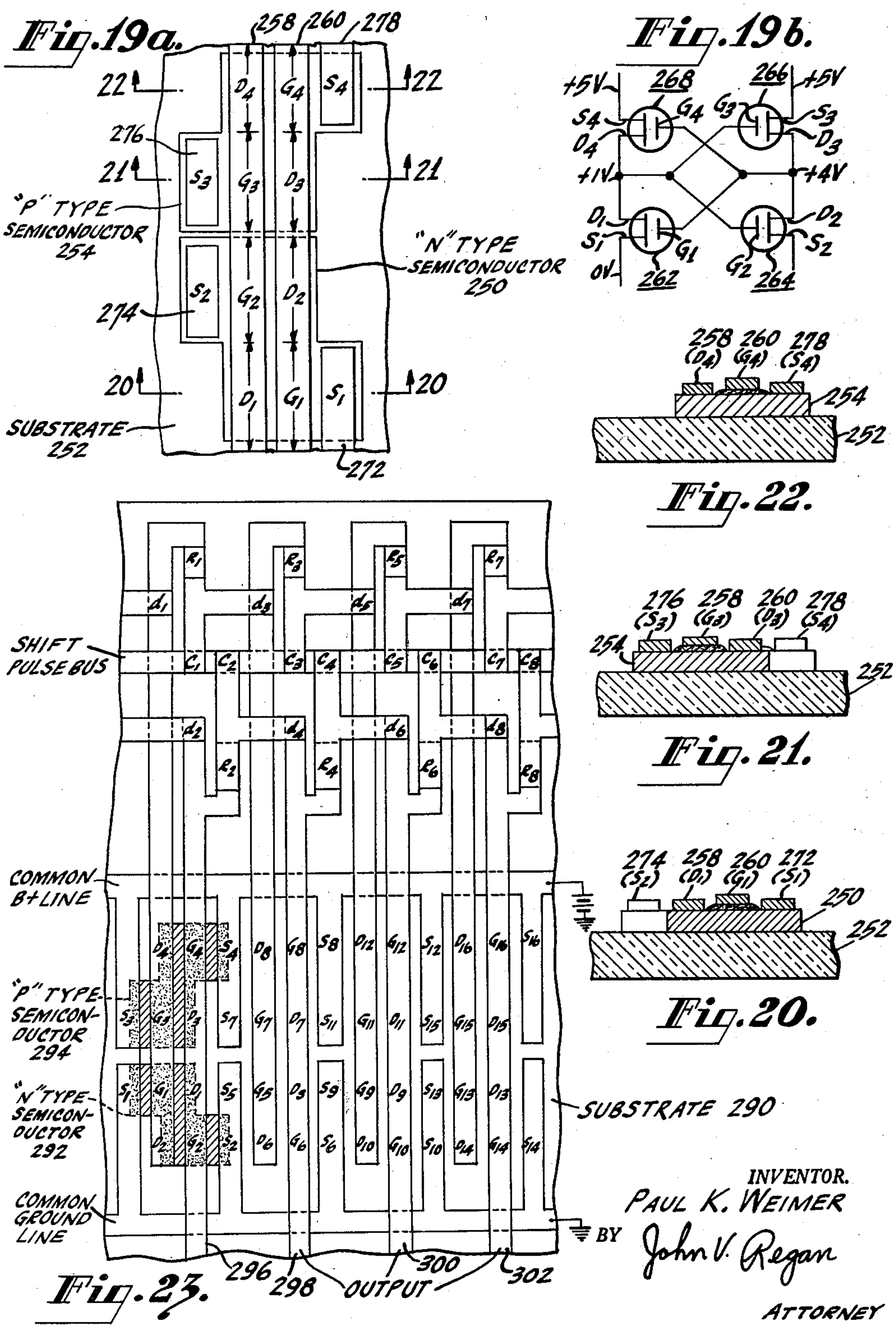
Figure 24:
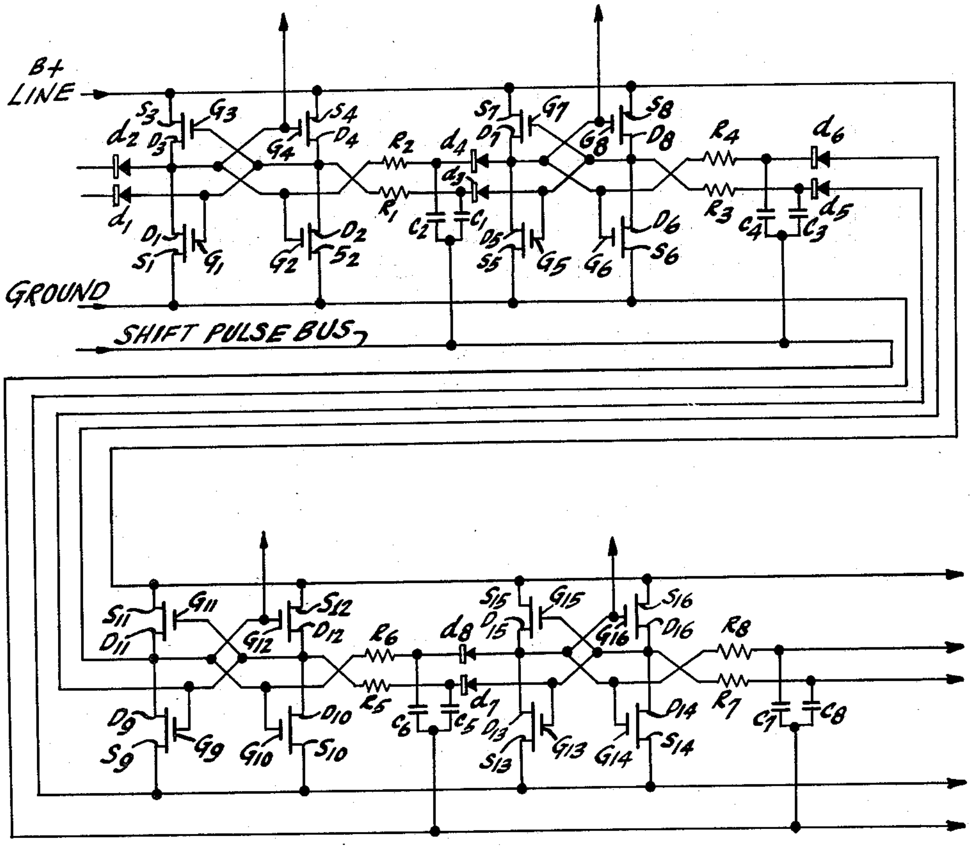

FIGURES 15(*a*) and 15(*b*) are, respectively, a plan view of another flip-flop structure according to the invention, and an equivalent circuit diagram thereof;

FIGURES 16–18 are sectional views taken along the lines 16—16, 17—17 and 18—18 of FIGURE 15(*a*);

FIGURE 19(*a*) is a plan view of a flip-flop structure according to the invention and which employs four interconnected thin film triodes;

FIGURE 19(*b*) is an equivalent circuit diagram of the flip-flop structure of FIGURE 19(*a*);

FIGURES 20–22 are sectional views taken along the lines 20—20, 21—21 and 22—22 of FIGURE 19(*a*);

FIGURE 23 is a plan view of a shift register structure according to the invention which employs flip-flops of the type illustrated in FIGURE 19(*a*); and FIGURE 24 is an equivalent circuit diagram of the shift register of FIGURE 23.

According to the invention, I take advantage of the fact that, in a thin film triode of the type described, the region of insulating material which separates the controls electrode from the layer of semiconductive material renders the control electrode substantially blocking in both directions. Hence, the control electrode conducts little or no current in either polarity direction. The control electrode may be considered as making an insulating contact to the semiconductive layer. The insulating material may be defined as one having a high resistivity as compared to the semiconductive material. Two such thin film triodes may be cross-coupled with direct connections, preferably of negligible impedance, from the output electrode of one triode to the control electrode of the other triode. The flip-flop operates with the expenditure of substantially no current through the cross-coupling in either of its two stable states.

Some examples of thin film triodes which may be used in practicing the present invention are described in my co-pending application, Serial No. 132,095, filed August 17, 1961, for "Solid State Devices," and assigned to the assignee of the present invention. As described in said copending application, the insulating material may be seelcted from the group consisting of insulators and wide-gap semiconductors which exhibit high resistivity. Silicon dioxide, aluminum oxide and calcium fluorde are listed therein as examples of suitable insulators. Zinc sulfide is also given as an example of a high resistivity semiconductor suitable for use as the insulating material. The reader is referred to the aforementioned application for further details of the device, its structure, method of fabrication and operating characteristics.

An advantage of the invention is that resistors, capacitors and diodes can be fabricated simultaneously with the thin film triodes by the same evaporation techniques. Since many components may be deposited simultaneously, the number of evaporation or deposition operations required for a complete circuit, such as a flip-flop, register, counter and the like increases very slowly or not at all with increasing complexity of the circuit.

Figures 1, 2A, 2B, 3:
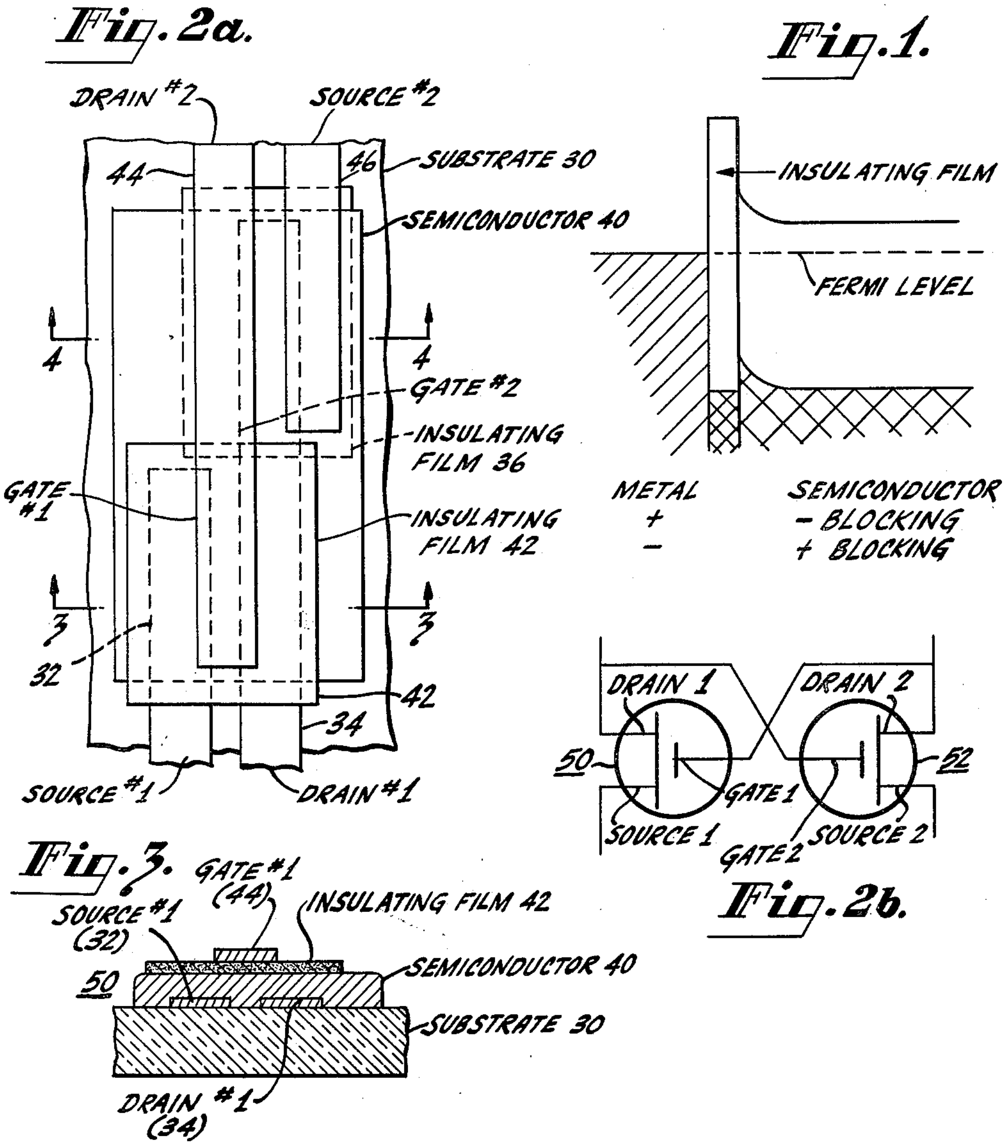

An insulating metal-to-semiconductor contact, as may be utilized for the insulated control electrodes of the devices embodying the invention, is illustrated by the energy level diagram of FIGURE 1. Between the metal and the semiconductor there is a region of insulating material, that is, a material which has a high resistivity relative to that of the semiconductor. The insulating material selected may have a band-gap which is sufficiently great that the barrier between the insulating material and the semiconductor is too high for charge carriers to be injected from the semiconductor into the conduction band of the insulating material. The insulating material then acts as a potential barrier, and blocks the flow of current from metal to semiconductor, or vice versa. No matter what polarity of gate bias is applied, a contact of this type is blocking even though charge carriers may be present in the semiconductor.

One embodiment of a flip-flop structure according to the invention is illustrated in plan view in FIGURE 2(*a*); its equivalent circuit is illustrated in FIGURE 2(*b*). The structure includes an insulating support 30, or substrate, such as a plate of glass, ceramic, fused quartz, or the like. On the top surface of substrate 30 are two spaced electrodes 32 and 34 which are substantially parallel to one another. One electrode 32 is shorter in extent than the other 34 and is located adjacent to, but spaced sideways from, approximately the lower half of the electrode 34, as viewed in the drawing. Electrodes 32 and 34 may consist of metals such as indium, gold, tin or the like, and may be deposited on the substrate 30 as thin films by masking or evaporating techniques. Alternatively, the electrodes may de deposited by a paste containing metallic particles which may be painted or silk screened on the desired portions of the substrate 30. Other techniques, such as sputtering, also may be employed to deposit the electrodes 32, 34 as thin films. The reader is referred to the aforesaid copending application for a more detailed description of techniques for fabricating these electrodes, and the insulating material and semiconductive layer to be described.

A first thin film of insulating material 36 is deposited on at least a portion of the substrate 30 and the upper half of the electrode 34. This film 36 may consist of one of the insulating materials described previously. For efficient operation, insulating film 36 preferably is less than about two microns thick.

A layer of semiconductive material 40 is deposited on the aforesaid top surface of the substrate 30 and covers a portion of the two spaced electrodes 32 and 34 and a portion of the insulating or wide-gap film 40. That portion of the electrode 34 which is separated from the semiconductor 40 by the insulating film 36 is an insulating contact to the semiconductor 40. The insulating material 36 is chosen so that the insulating contact does not conduct appreciable current in either direction.

The semiconductive material is a crystalline substance which exhibits a periodic potential field, at least on an atomic scale, and may be either monocrystalline or polycrystalline. Suitable materials for the semiconductive layer 40 include elemental semiconductors such as germanium, silicon, and germanium-silicon alloys; group III–V compounds such as the phosphides, arsenides, and antimonides of aluminum, calcium and indium; and group II–VI compounds such as the sulfides, selenides and tellurides of zinc and cadmium. Zinc oxide also may be classed as a group II–VI compound. The electrical resistance of some of the group II–VI compounds is sufficiently high so that these materials may be regarded as insulators rather than semiconductors, and may be used as the material for making insulating contacts on other semiconductors which have a lower resistivity. In particular, the semiconductive layer 40 preferably may be cadmium sulfide which exhibits a periodic potential field, at least on an atomic scale. The insulating film 36 may be silicon dioxide, by way of example, when polycrystalline cadmium sulfide is used as the semiconductor material 40.

A second insulating film 42 is deposited on a portion of the lower half of the semiconductor 40 and covers at least a portion of the gap or separation between the electrodes 32 and 34. A second pair of electrodes 44, 46 then is deposited on top of the structure thus far described. The electrode 46 is shorter than the electrode 44 and is adjacent to, and separated to the right from, approximately the upper half of the electrode 44. The electrode 46 is deposited on the top of the semiconductive layer 40. The upper portion of the electrode 44 also is deposited on the surface of the semiconductive layer 40 and the lower half of this electrode 44 is deposited on top of the second insulating film 42. The second insulating film 42 may be of the same material as the first insulating film 36. Also, the electrodes 44 and 46 may be the same in composition as the other two electrodes 32 and 34.

The insulating films 36 and 42 define regions of insulating material which separate the adjacent portions of electrodes 34 and 44, respectively, from the semiconductive material 40 to form insulated control contacts. Films 36 and 42 may be thin layers deposited in a manner described in the copending application, for example. The regions of insulating material may be formed by other methods also. The term "insulated film" is used herein and in the appended claims to define the region of insulating material, however formed.

Electrode 32 and the adjacent spaced portion of the electrode 34, the insulated portion of electrode 44 which is opposite the gap between electrodes 32 and 34, and the semiconductive material 40 between these electrodes constitute a first thin film triode 50. A cross-sectional view of this triode 50 is illustrated in FIGURE 3, wherein the electrodes are functionally named to correspond to the descriptive labels used in the equivalent circuit of FIGURE 2(*b*). The separation between the source and drain electrodes 32 and 34 preferably is less than about 100 microns. Advantageously, the gate electrode 44 spans the entire gap or separation between these electrodes 32 and 34, although this is not essential to satisfactory operation.

Figure 4:
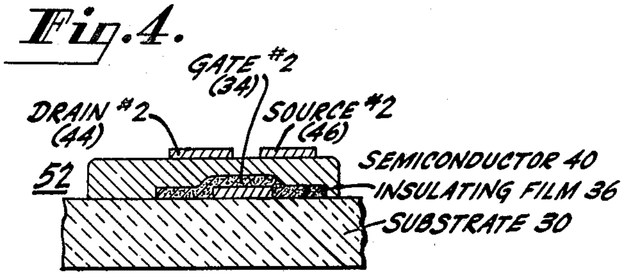

The upper portions of the electrodes 44 and 34 are the drain and gate electrodes, respectively, of a second thin film triode 52, of which electrode 46 is the source electrode. Accordingly, the drain electrode of each triode is directly connected to the gate electrode of the other triode. A cross-sectional view of the second triode 52 is illustrated in FIGURE 4. Note that the gate electrode of this triode 52 spans the entire gap between the source 42 and drain 44 electrodes thereof.

Although the source and drain electrodes of the triodes 50, 52 are on opposite sides of the semiconductor from the associated gate in FIGURES 2–4, it is also possible to deposit all four electrode strips on the same side of the semiconductor, with a narrow gap between electrodes if desired. The gate ends of the two long strips 34, 44 may be of the same or different metal as the drain ends, but if the metal is the same, a region of insultaing material must be used to separate each gate portion from the semiconductor. An example of a flip-flop structure wherein all of the electrodes are on the same side of the semiconductive layer is illustrated in FIGURE 19(*a*), and will be described hereinafter.

The substrate 30 of FIGURE 2(*a*) is shown broken away to indicate that the flip-flop, as described, may be a component part of a larger integrated structure, such as a shift register. In the latter event, the drain and source electrodes may be connected to electrodes of adjacent flip-flops by means of fabrication techniques aforementioned. Leads for applying operating potentials to the electrodes may be connected to the electrodes by means of a metallic paste, such as silver paste. In particular, each of the drain electrodes may be connected through a separate resistor (not shown) to a source of biasing potential, and each of the source electrodes may be connected to a point of reference potential, such as circuit ground. The polarity of the operating potential applied to the drain electrodes depends upon whether the semiconductive material 40 is N-type, such as cadmium sulfide, or P-type, such as germanium.

Figures 5, 6A, 6B, 7:
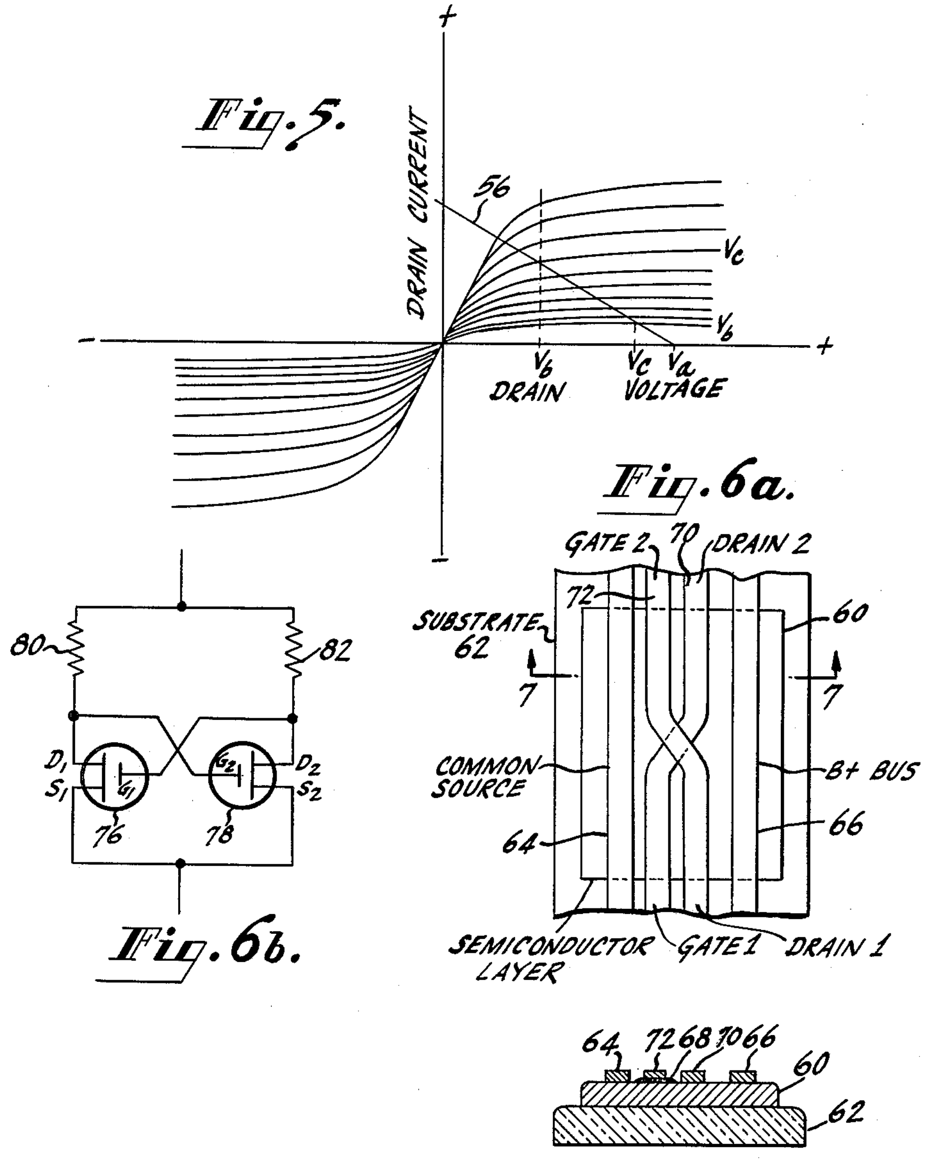
FIGURE 7 is a cross-sectional view of the flip-flop taken along the line 7—7 of FIGURE 6(*a*)

FIGURE 5 is a set of typical operating characteristics for a thin film triode. Drain voltage, relative to source voltage, is plotted along the abscissa, and drain current is plotted along the ordinate. The set of characteristics in the first quadrant is for an N-type semiconductor, in which case the drain potential is positive relative to the source potential. The set of characteristics in the third quadrant is for the P-type material, in which case the drain potential is made negative relative to the source potential.

Consider by way of example that the semiconductor 40 is an N-type material and the source electrodes are grounded. Operation of the flip-flop may be determined by drawing a load line 56 which intersects the abscissa at a point $+V_a$, the drain energizing potential, and which has a slope equal to $-1/R_L$, where $R_L$ is the load impedance. Assume that the voltage at the gate of the first triode 50 is $+V_c$ volts. The voltage at the drain electrode of this triode 50 then is $+V_b$ volts. This voltage is applied to the gate electrode of the second triode 52 by way of the direct connection to the drain electrode of triode 50. The characteristic for a gate bias of $+V_b$ volts intersects the load line 56 at a point corresponding to a drain voltage of $+V_c$ volts, which is the voltage at the gate electrode of the first triode 50. In the other state of the flip-flop, the voltage at the drain electrode of the second triode 52 and the gate of the first triode 50 is $+V_b$ volts, and the voltage at the gate of the second triode 52 and the drain of the first triode 50 is $+V_c$. Depending upon the type of semiconductive material, the operating potentials may be chosen so that one triode of the flip-flop is nonconductive while the other triode is conductive, relatively speaking, and vice versa.

A semiconductive material which has a large number of unfilled traps generally will have a high impedance, and little or no current will flow between source and drain until the voltage at the gate is made more positive than the source voltage for N-type material, or more negative than the source voltage for P-type material. Such a triode is operable only in the current enhancement, or carrier enrichment, mode. However, if the semiconductive material is doped so that the material has a high free charge density with zero gate bias, current will flow between source and drain at zero gate bias. Such a triode may be operated in the current enhancement mode by biasing the gate more positive than the source for N-type material and more negative than the source for P-type material. The triode may be operated in the current depletion mode by applying gate bias potentials of the opposite polarities to those immediately aforementioned. Regardless of the mode of operation, the gate electrode draws little or no current, whereby direct coupling between stages is permitted, since the insulated gate electrode can be biased either positively or negatively with respect to its source electrode.

It will be understood that the electrodes, insulating films and semiconductive material in the other devices to be described hereinafter may be deposited in the same manner described above and in the copending application. Also, the materials of which the components are constructed may be the same as described previously. Another embodiment of a flip-flop according to the invention is illustrated in plan view in FIGURE 6(*a*). All of the electrodes are shown deposited on the same surface of the layer of semiconductive material. A layer of semiconductive material 60 is deposited on the top surface of a substrate 62. Two strip electrodes 64 and 66 are deposited on top of the semiconductor layer 60 and spaced parallel from one another. A thin film 68 of insulating material, not shown in FIGURE 6(*a*) in order to avoid confusion in the drawing, is deposited on the top surface of the semiconductor layer 60 adjacent the electrode 64. The lower portion of a third electrode 70 is deposited on the insulating film parallel to, and spaced from, the lower half of electrode 64. The curved, central part and the upper portion of the electrode 70 are deposited on top of the semiconductor layer 60, with the upper portion parallel to, and spaced from, the electrode 66. A fourth electrode 72, of substantially the same shape as third electrode 70, has a first portion deposited on the insulating film and spaced from electrode 64. The remainder of the fourth electrode 72 is deposited on the top surface of the semiconductor layer 60, with the exception of the point of cross-over with the third electrode 70. A relatively thick layer of insulating material may be interposed between the electrodes 70 and 72 at the cross-over point to provide electrical isolation.

Electrode 64 is a source electrode common to two thin film triodes, designated 76 and 78 in the equivalent circuit diagram of FIGURE 6(*b*). The lower portions of the electrodes 70 and 72 are the gate and drain electrodes $G_1$, $D_1$, respectively, of one of the triodes. The upper portions of the electrodes 72 and 70 are the gate and drain electrodes $G_2$, $D_2$, respectively, of the other triode. Accordingly, the drain electrode of each triode is directly connected to the gate electrode of the other triode. Electrode 66 serves as a common B+ bus or supply line. The semiconductor material 60 between the B+ electrode 66 and the adjacent segments of electrodes 70 and 72 is resistive and is represented in the equivalent circuit of FIGURE 6(*b*) by resistors 80 and 82. For a given semiconductor, the values of these resistors 80 and 82 may be suitably fixed by properly spacing the electrode 66 relative to the adjacent segments of electrodes 70 and 72. A cross-sectional view of one portion of the flip-flop is shown in FIGURE 7.

Figures 8, 9, 10A, 10B, 11, 12, 13:
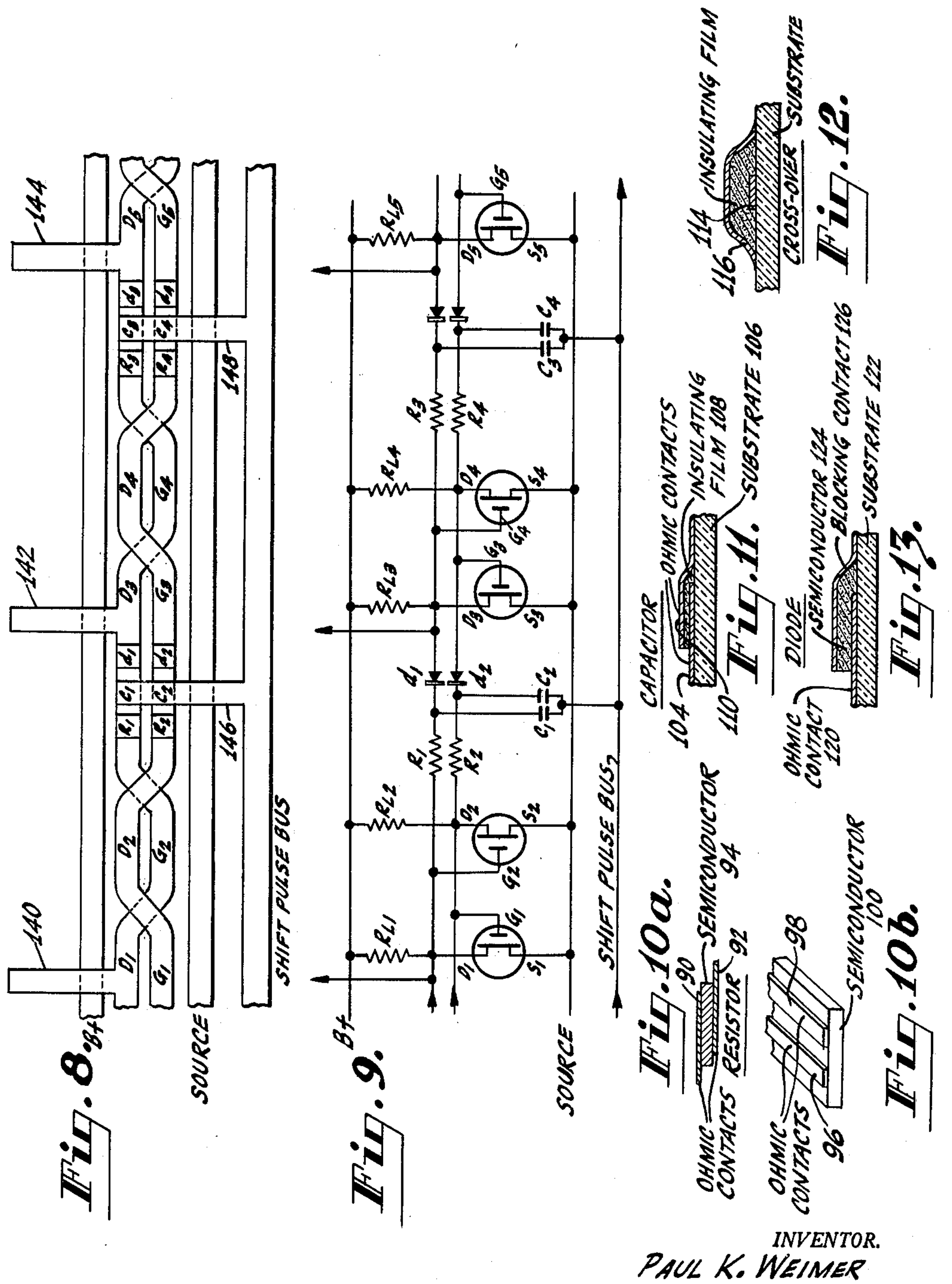

One advantage of the flip-flop circuits of the present invention is that they lend themselves readily to integration in a large system. A portion of a shift register which employs flip-flops of the FIGURE 6(*a*) type is illustrated in plan view in FIGURE 8, and its equivalent circuit diagram is illustrated in FIGURE 9. Before discussing the shift register, however, the method of fabricating certain components used therein will first be described in connection with FIGURES 10–13.

FIGURES 10(*a*) and 10(*b*) are illustrations of two methods of forming a resistor by thin film techniques. In FIGURE 10*a*, a pair of ohmic contacts 90 and 92 are deposited on opposite surfaces of a layer of semiconductive material 94. The resistance of the element is determined by the thickness of the layer of semiconductive material 94, the type of semiconductive material and the areas of the opposed contacts 90, 92. Contacts 90 and 92 may be, for example, tin, indium or gold for a cadmium sulfide semiconductor. The resistor according to FIGURE 10(*b*) comprises two ohmic contact electrodes 96 and 98 deposited on the same surface of a layer of semiconductive material 100 and spaced apart from one another. The resistance provided thereby is determined by the spacing between the contacts 96, 98, the length of these contacts and the type of semiconductor. A substrate (not shown) may support the structures of FIGURES 10(*a*) and 10(*b*). Another known from of thin film resistor (not illustrated) consists of an elongated strip of evaporated metal such as Nichrome.

FIGURE 11 is a cross-sectional view of a thin film capacitor. The capacitor comprises a first ohmic contact 104 deposited on the top surface of a substrate or support 106. A thin, insulating film 108 separates the first ohmic contact 104 from a second ohmic contact 110. The capacitance of the element is determined by the areas of the opposed contacts 104 and 110, the thickness of of the insulating film 108 and the dielectric constant of the insulating film. An insulated cross-over for two contacts 114, 116 may be provided, as illusttared in FIGURE 12, by making the layer of insulating film thick enough so that there is negligible capacitance between the contacts 114 and 116.

A cross-sectional view of a diode is illustrated in FIGURE 13. The diode comprises an ohmic contact 120 deposited on the top surface of the substrate 122. A layer of semiconductive material 124 is deposited on the substrate 122 and covers a portion of the ohmic contact 120. A blocking contact 126 is deposited on top of the semiconductor 124 opposite the portion of the ohmic contact covered by the semiconductive material 124. The blocking contact 126 for a cadmium sulfide semiconductor may be, for example, tellurium.

Two and one-half stages of an integrated shifted register employing the flip-flop of FIGURE 6(*a*) are illustrated in plan view in FIGURE 8. In FIGURE 8 an interstage coupling resistor is designated by "R," a capacitor is designated by "C" and a diode is designated by "*d*." The thin film triodes and the drain resistors may be fabricated according to the method described previously in connection with FIGURE 6(*a*). The resistors, capacitors and diodes may be fabricated according to the techniques described above in connection with FIGURES 10–13.

Information stored in the register stages may be read out at connections 140 . . . 144 to the drain electrodes $D_1$, $D_3$ and $D_5$. These connections to the drain electrodes may be deposited at the same time as the corresponding drain electrodes. A film of insulating material (not shown) is deposited on top of the B+ bus and interposed between this bus and the electrodes 140 . . . 144. The horizontal portion of the shift pulse bus is deposited directly on the substrate. The vertical projections 146, 148 from the shift bus are separated from the common source electrode 147 by means of a layer of insulating material (not shown) of sufficient thickness so that there is no capacitive coupling therebetween. These vertical projections 146 and 148 are separated from the metallic electrodes which connect the resistors and associated diodes by a thin layer of insulating material (not shown) having a thickness to provide the desired capacitance.

The FIGURE 8 shift register has the feature that all of the components may be deposited either on the top surface of the semiconductive material (not shown) or on an exposed portion of the substrate, which is advantageous in some applications. For example, connections may be readily made to any of the components, which is not the case when some of the components are located between the substrate and the semiconducting material. One disadvantage of the circuit is that the cross-coupling connections between the drain of one triode and the gate of the other triode in the same flip-flop, and the connections between adjacent stages, are not along straight lines. Moreover, the spacing between adjacent output electrodes 140, 142, and 144 may be greater than desirable in some applications because of the circuit layout. If the shift register is used, for example, as a scanner for television displays, it would be desirable to have the output electrodes 140, 142 and 144 located more closely together.

Figure 14:
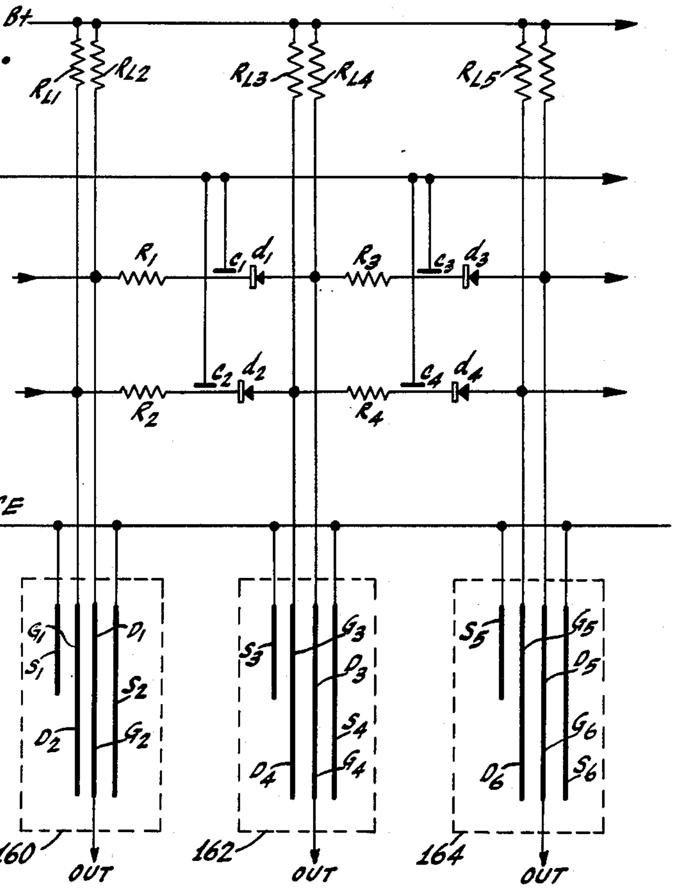
FIGURE 14 is a line drawing of another shift register structure according to the invention.

A shift register in which the flip-flop of FIGURE 2(*a*) may be employed is illustrated in a line drawing in FIGURE 14. Each of the dashed boxes 160 . . . 164 includes a flip-flop of the type illustrated in FIGURE 2(*a*) and described previously. A modified form of this flip-flop also may be used wherein all of the electrodes are deposited on the same surface of the layer of semiconductive material. FIGURE 9 is the equivalent circuit diagram of this shift register, as well as the shift register of FIGURE 8, and components in FIGURE 14 are designated by the same reference characters.

The FIGURE 14 shift register has the advantage that all of the electrodes are strip type and are parallel to one another, admitting of ease in fabrication. Because the interconnecting circuitry comprising the resistors, diodes and input capacitors is located separately from the flip-flops themselves, the flip-flops may be located physically closer to one another than is possible in the embodiment of FIGURE 8. Accordingly, the output electrodes of the individual flip-flops may be spaced more closely together. In FIGURE 14, the circuitry outside the dashed boxes 160 . . . 164 may be deposited directly on the supporting substrate (not shown). Resistors, diodes, capacitors and cross-overs are fabricated according to the techniques illustrated in FIGURES 10–13.

FIGURE 15(*a*) is another embodiment of a flip-flop according to the present invention. The equivalent circuit of this flip-flop is illustrated in FIGURE 15(*b*). The insulating films are not shown in FIGURE 15(*a*) in order to avoid confustion in the drawing, although these films are illustrated in the cross-sectional views of FIGURES 16–18. In the fabrication of this flip-flop, four electrodes 180 . . . 186, are deposited on the top surface of a supporting substrate (not shown). The vertical segment of the electrode 186 is aligned with the short electrode 184, and the lower left corner of the electrode 180 overlaps the upper right portion of the electrode 184, making physical and electrical contact therewith (FIGURE 17).

An insulating film 190 (FIGURES 17 and 18) is deposited on the lower half of the substrate and overlays the electrode 184 and most of the electrode 186. The free end of the horizontal segment of electrode 186 is not covered by the insulating film 190, in order that an electrical connection may be made between this electrode 186 and an external signal source. A long electrode 192, which extends the length of the structure, has its upper half deposited on the substrate and its lower half deposited on the insulating film 190. A layer of semiconductive material 194 next is deposited on top of the structure thus far described, with the outer ends of the electrodes 180, 182, 186 and 192 left exposed so that connections may be made thereto.

A second insulating film 198 (FIGURES 16 and 17) is deposited on the upper half of the layer of semiconductive material 194. Electrodes 200 and 202 are deposited on top of the second insulating film 198, the electrode 202 and the vertical leg of electrode 200 being aligned and spanning the gap or separation between underlying electrodes 180 and 182. The other electrodes 204 and 206 are deposited on top of the semiconductive material 194 and positioned so that the underlying electrodes 184 and 186 span the gap between them. The upper left corner of electrode 204, as viewed in the drawing, makes contact with the lower right corner of electrode 202 (FIGURE 17).

The component parts of the thin film triodes shown in the cross-sectional views of FIGURES 16, 17 and 18 are designated by numerical reference characters corresponding to those used in FIGURE 15(*a*), and also are designated by descriptive alphabetic reference characters corresponding to those used in the equivalent circuit of FIGURE 15(*b*). It may be seen in FIGURES 15(*a*) and 17 that the drain electrode of each triode is directly connected with negligible resistance to a gate electrode of the other triode. The resistance of the semi-conductive material 194 between the drain electrodes 180, 204 and the common B+ line 192 is symbolized by the resistors 212 and 214, respectively, in FIGURE 15(*b*).

Note that each of the triodes has two gate electrodes. The first gate electrode $G_1$ or $G_2$ is directly connected to the drain electrode $D_2$ or $D_1$, respectively, of the other triode. Input signals for switching the flip-flop from one stable state to the other may be applied at the other gate electrodes $g_1$ and $g_2$.

Another embodiment of a flip-flop structure is illustrated in plan view in FIGURE 19(*a*), and its equivalent circuit is illustrated in FIGURE 19(*b*). In the fabrication of this structure, a first layer of an N-type semiconductive material 250 is deposited on a portion of the lower half of a substrate 252. The semiconductive material may be cadmium sulfide by way of example. A second layer of P-type semiconductive material 254 is deposited on a portion of the upper half of the substrate 252 and separated from said first layer 250. Layer 254 may be, for example, suitably doped lead sulfide.

Two long, parallel strip electrodes 258 and 260 serve the functions of drain and gate electrodes for four thin film triodes 262 . . . 268. Those portions of the electrodes 258, 260 which serve as gate electrodes, and which are so designated in FIGURE 19(*a*), are separated from the associated semiconductive material 250, 254 by regions of insulating material which may be wider in extent than the electrodes 258, 260 themselves (see FIGURES 20, 21 and 22). Remaining portions of these electrodes 258, 260 serve as drain electrodes and are deposited on the semiconductive materials 250 or 254. The ends of these electrodes 258 and 260 extend beyond the semiconductive material and may be deposited on the substrate 252.

Third and fourth short, metallic electrodes 272 and 274 are deposited on top of the layer of N-type material 250 adjacent those portions of electrodes 260 and 258 designated "$G_1$" and "$G_2$," respectively. Fifth and sixth short, metallic electrodes 276 and 278 are deposited on top of the layer of P-type semiconductive material 254 adjacent the portions of electrodes 258 and 260 which are designated "$G_3$" and "$G_4$," respectively. The latter four electrodes 272 . . . 278 are source electrodes for the thin film triodes 262 . . . 268, respectively (FIGURE 19(*b*)).

Besides its ease of fabrication, a flip-flop of the type illustrated in FIGURE 19 has the advantage that it will remain in a quiescent steady state without any appreciable drawing current when the semiconductive materials 250 and 254 are doped so that the triodes 262 . . . 268 can operate only in the enhancement mode. Triodes 262 and 264 may be considered the cross-coupled active devices of the flip-flop. Triodes 266 and 268 operate as variable impedance elements serving the function of the load resistors, in the basic flip-flop circuits and enhance the operation of the flip-flop in a manner to be described.

It will be recalled from the description of FIGURE 5 that a semiconductive material which has a large number of unfilled traps at zero gate-to-source bias has a high impedance between source and drain. When the gate is made more positive in potential than the source, for N-type material, electrons are drawn into the semiconductive material, and the impedance between source and drain is lowered. If the semiconductor is P-type, holes are drawn into the material when the gate voltage is made negative with respect to the source voltage. The gate-to-source voltage differential at which substantial filling of traps, and consequent lowering of impedance, occurs, is a function of the doping and can be controlled. Moreover, the impedance between source and drain for a given material is a function of the gate bias and does not depend upon continuous current flow between the source and drain electrodes. In this sense, the triode acts somewhat as a switch, with the metallic gate electrode functioning to open and close the switch by controlling the conductivity of the path between source and drain.

Consider now the operation of the flip-flop and assume that the source electrodes of triodes 262 and 264 are grounded, and that the source electrodes of triodes 266 and 268 are connected directly to a voltage supply of +5 volts. Assume further that the impedance between source and drain of a triode remains very high until the gate-to-source voltage differential exceeds one volt. Initially, the triode 262 may be in the low impedance state by virtue of having been so triggered from an external source. The impedance between source $S_1$ and drain $D_1$ then is low and the drain $D_1$ voltage may be +1 volt. This voltage applied at the gate $G_2$ of triode 264 is insufficient to lower the impedance apperciably between source $S_2$ and drain $D_2$.

The impedance between the drain $D_3$ and source $S_3$ drops to a low value because the gate $G_3$ is four volts negative relative to the source $S_3$. (The semiconductive material of triode 266 is P-type.) Accordingly, the voltage drop between source $S_3$ and rain $D_3$ may be only about one volt, whereby the drain $D_3$ voltage is +4 volts. This voltage applied at the gate $G_1$ of triode 262 keeps this triode in a state of low impedance. The +4 volts applied at the gate $G_4$ of triode 268, howevr, results in a voltage differential of only one volt between source $S_4$ and gate $G_4$. Accordingly, the impedance between source $S_4$ and gate $G_4$ is high.

In summary, triodes 262 and 266 are in their low impedance states, and the triodes 264 and 268 are in their high impedance states. The only paths for current flow through the triodes 262 and 266 are through the drain-source paths of triodes 268 and 264, respectively. Because of the high impedances of these paths, little or no current flows through the triodes 262 and 266, and the steady state power dissipation is very low. The flip-flop may be switched to its other stable state by applying a positive voltage signal at the gate $G_3$ of triode 264, for example. All of the triode 262 . . . 268 then reverse states.

FIGURE 23 is a plan view of four stages of an evaporated, integrated shift register, each stage of which employs a flip-flop of the type illustrated in FIGURE 19. FIGURE 24 is an equivalent circuit diagram of the four stages. In FIGURE 23 resistors, capacitors and diodes are denoted by the letters "R," "C" and "D," respectively, with numerical subscripts corresponding to the reference characters of FIGURE 24. All of these components and the cross-overs of connecting lines may be fabricated in the manner illustrated in FIGURES 10–13 and described previously. The entire structure is supported on a substrate 290.

The semiconductive materials 292 and 294 of each flip-flop are deposited on the top surface of the substrate 290. The N-type semiconductor 292 and the P-type semiconductor for the left-most flip-flop only are outlined in FIGURE 23. The pattern of semiconductive materials is the same for the other flip-flops. It will be noted that the semiconductive material extends only a portion of the way across the width of the source S and drain D electrodes. This allows close spacing of the electrodes in a horizontal direction, while assuring that there is no coupling between the drain D electrode of one stage and the source S electrode of the next adjacent stage, $D_1$ and $S_5$ for example. A region of insulating material is interposed between each of the gate G electrodes and the semiconductive material, as shown in FIGURES 20–22.

It is to be noted that all critical gaps in the layout arrangement of FIGURE 23 are parallel to the output electrodes 296 . . . 302, thus permitting easy construction using the masking wire technique described in the aforesaid copending application. Geometrical layouts which permit all critical dimensions of the pattern to be determined by parallel masking wires in an evaporator yield a compact evaporated circuit. Extreme compactness is desirable in applications such as shift registers, memory arrays and scanning circuits for solid state television pick-up and display panels. The flip-flops of FIGURES 19(*a*) and 23 are particularly well adapted to thin film triode construction in which all of the electrodes are located on the same surface of the semiconductive material.

What is claimed is:

1. A solid state circuit arrangement comprising: first and second devices each having a body of semiconductive material, a source contacting said body, a drain contacting said body and being spaced from said source, and a gate spaced from said body by a region of insulating material having a higher resistivity than said semiconductive material, said gate extending over at least a portion of the space between the associated source and drain; first means connected between, and maintaining at the same potential, the drain of the first device and the gate of the second device; and second means connected between, and maintaining at the same potential, the drain of the second device and the gate of the first device.

2. In combination: first and second devices each having a layer of semiconductive material, first and second ohmic electrodes contacting said layer, a film of insulating material in physical contact with at least a portion of said layer between said first and second electrodes and having a higher resistivity than said semiconductive material, and a third ohmic electrode on said film; the third electrode of the first device being integral with the second electrode of the second device, and the third electrode of the second device being integral with the second electrode of the first device.

3. A solid state structure comprising: a layer of semiconductive material; a first, elongated ohmic electrode having a first portion deposited on said layer and having a second portion separated from said layer by a region of insulating material; a second, elongaed ohmic electrode parallel to, and spaced from, said first electrode and having a first portion deposited on said layer adjacent the second portion of said first electrode, said second electrode having a second portion adjacent to the first portion of said first electrode and separated from said layer by a region of insulating material; a third ohmic electrode deposited on said layer adjacent to the second portion of said first electrode; and a fourth ohmic electrode deposited on said layer adjacent to the second portion of said second electrode.

4. A solid state structure comprising: a layer of semiconductive material; a first, elongated ohmic electrode having a first portion deposited on said layer and having a second portion separated from said layer by a region of insulating material; a second, elongated ohmic electrode parallel to, and spaced from, said first electrode and having a first portion deposited on said layer adjacent the second portion of said first electrode, said second electrode having a second portion adjacent to the first portion of said first electrode and separated from said layer by a region of insulating material; a third ohmic electrode deposited on said layer adjacent to the second portion of said first electrode; a fourth ohmic electrode deposited on said layer adjacent to the second portion of said second electrode; and means for applying operating potentials between the said third electrode and said second electrode, and between said fourth electrode and said first electrode.

5. A solid state structure comprising: a layer of semiconductive material; an elongated source electrode deposited on one face of said layer; first and second drain electrodes deposited on the same one face of said layer and aligned parallel to said source electrode; first and second gate electrodes located between the first and second drain electrodes, respectively, and said elongated source electrode, and each separated from the one face of said layer by a region of insulating material which has a higher resistivity than said semiconductive material; a first film of electrically conductive material deposited on said one face and joining the first gate electrode to the second drain electrode; a second film of electrically conductive material deposited on said one face and joining the second gate electrode and the first drain electrode, said second film crossing over said first film and being separated therefrom at the area of cross-over by a layer of insulating material.

6. The combination as claimed in claim 5 wherein said first gate electrode, said first film and said second drain electrode are different portions of a first conductive film and wherein said second gate electrode, said second film and said first drain electrode are different portions of a second conductive film.

7. The combination as claimed in claim 5 including an elongated ohmic electrode deposited on said layer and having a first portion adjacent to said first drain electrode and a second portion adjacent to said second drain electrode; and means for biasing said ohmic electrode relative to said source electrode.

8. A flip-flop comprising: a first thin film triode having a layer of N-type semiconductive material, an ohmic source electrode and an ohmic drain electrode deposited on said layer and separated from each other by a gap, and an ohmic gate electrode separated from said layer by a region of insulating material and spanning at least a portion of said gap; a second thin film triode similar to said first thin film triode; a third thin film triode having a layer of P-type semiconductive material, an ohmic source electrode and an ohmic drain electrode deposited on said P-type material and separated from each other by a gap, an ohmic gate electrode separated from said P-type material by a region of insulating material and spanning at least a portion of the last-mentioned gap; a fourth thin film triode similar to said third film triode; means electrically connecting the drain electrodes of said first and third triodes together and to the gate electrodes of said second and fourth triodes; and means electrically connecting the drain electrodes of said second and fourth triodes together and to the gate electrodes of said first and third triodes.

9. The flip-flop as claimed in claim 8 wherein the drain electrodes of said first and third triodes and the gate electrodes of said second and fourth triodes are directly connected to one another by negligible impedance means, and wherein the drain electrodes of said second and fourth triodes and the gate electrodes of said first and third triodes are directly connected to one another by negligible impedance means.

10. The flip-flop as claimed in claim 9 wherein the source electrodes of said first and second triodes are connected to a first common point, the source electrodes of said third and fourth triodes are connected to a second common point, and means for connecting a source of operating potential across the first and second common points.

11. A flip-flop structure comprising: a first layer of one conductivity type semiconductive material; a second layer of the opposite conductively type semiconductive material spaced from said first layer; a first, elongated strip of ohmic material having a first portion deposited on said first layer, a second portion separated from said first layer by a region of insulating material, a third portion separated from said second layer by a region of insulating material, and a fourth portion deposited on said second layer; a second, elongated strip of ohmic material parallel to said first strip and spaced therefrom, said second strip having a first portion separated from said first layer by a region of insulating material, second and third portions deposited on said first and second layers, respectively, and a fourth portion separated from said second layer by a region of insulating material, the first, second, third and fourth portions of said second strip being adjacent the first, second, third and fourth portions, respectively, of said first strip; third and fourth strips of ohmic material deposited on said first layer adjacent the second portion of said first strip and the first portion of said second strip, respectively; and fifth and sixth strips of ohmic material deposited on said second layer adjacent the third portion of said first strip and the fourth portion of said second strip, respectively.

12. The flip-flop structure as claimed in claim 11 wherein the third and fourth strips are electrically connected in common and wherein the fifth and sixth strips are electrically connected in common.

13. The flip-flop structure as claimed in claim 11 including means for applying a potential across said third and fifth strips and across said fourth and sixth strips.

14. An N-stage shift register comprising, in combination: N pairs of thin film triodes, each triode including a layer of semiconductive material, an ohmic source electrode and an ohmic drain electrode deposited on said layer and spaced from each other by a gap, and an ohmic gate electrode separated from said layer by a region of insulating material and spanning at least a portion of said gap; negligible impedance means cross-coupling the drain and gate electrodes of the two triodes of each said pair of triodes; a resistor and a diode serially connected between the drain electrode of the first triode in one stage and the drain electrode of the first triode in the next succeeding stage; a resistor and a diode serially connected between the drain electrode of the second triode in one stage and the drain electrode of the second triode in the next succeeding stage; and capacitive means for applying shift pulses at the junction of each said resistor and its associated said diode.

15. In combination: first and second devices each having a source and a drain contacting a body of semiconductive material, said body defining a current path between said source and said drain, and a gate insulated from said body and overlying at least a portion of said current path between said source and said drain; and negligible impedance means directly connecting the drain of each device to the gate of the other device.

16. In combination: a first device having a first source and a first drain contacting a body of p-type semiconductive material and defining the ends of a current path through said body of p-type material, and a first gate insulated from said body of p-type material and overlying at least a portion of the current path between said first source and first drain; a second device having a second source and a second drain contacting a body of n-type semiconductive material and defining the ends of a current path through the latter said body, and a second gate insulated from said body of n-type material and overlying at least a portion of the current path between said second source and second drain; negligible impedance means connecting one of said first source and first drain to the corresponding one of said second source and second drain; means connecting the other one of said first source and first drain and the corresponding one of the second source and second drain to a source of operating potential; and means directly connected to both the first gate and the second gate for conditioning one of the first and second devices for operation in a relatively high conductivity state and for simultaneously conditioning the other of said devices for operation 'n a relatively low conductivity state.

17. A flip-flop comprising, in combination: first and second P-type semiconductor amplifying devices, and first and second N-type semiconductor amplifying devices, each of said devices having a control electrode, an otuput electrode, and a third electrode, and a current path between each third electrode and the associated output electrode; negligible impedance means connecting the output electrodes of the first P-type device and the first N-type device to each other and to the control electrodes of the second P-type device and the second N-type device; and negligible impedance means connecting the output electrodes of the second P-type device and second N-type device to each other and to the control electrodes of the first P-type and first N-type device.

18. The combination as claimed in claim 17, including means for connecting the third electrodes of the first N-type device and second N-type device to a point of first potential, and means connecting the third electrodes of the first P-type device and second P-type device to a point of second, different operating potential.

19. In combination: a body of semiconductive material; first and second devices each having first and second spaced electrodes contacting said body and defining the ends of a current path through said body, and a control electrode spaced from said current path by an insulator and extending over at least a portion of the space between said first and second electrodes; and means connecting the second electrode of each device to the control electrode of the other device and maintaining the control electrode of each device at the same potential as the second electrode of the other said device.

20. In combination: a body of semiconductive material; a first drain and a first source contacting one surface of said body and defining the ends of a first current path through said body; a first gate separated from the opposite surface of said body by an insulator at a location facing at least a portion of said first current path; a second drain contacting said opposite surface and making contact with said first gate; a second source contacting said opposite surface, said second source and second drain defining the ends of a second current path through said body; and a second gate separated from said one surface by an insulator at a location facing at least a portion of said second current path, and making contact with said first drain.

21. The combination comprising: a body of semiconductive material; a first electrode having a first portion contacting said body and a second portion separated from said body by an insulator; a second electrode having a first portion contacting said body adjacent to, and spaced from, the second portion of the first electrode, and having a second portion separated from said body by an insulator and being located adjacent to, and spaced from, the first portion of said first electrode; a third electrode contacting said body, and being located with the second portion of the first electrode interposed between said third electrode and the first portion of said second electrode; and a fourth electrode contacting said body, and being located with the second portion of said second electrode interposed between said fourth electrode and the first portion of said first electrode.

22. The solid state structure defined in claim 21 wherein said third electrode and said fourth electrode are different portions of an elongated electrode.

23. A flip-flop comprising: a first device having a body of n-type semiconductive material, a source and a drain contacting said body and defining the ends of a current path through said body, and a gate spaced from said body by an insulator and overlying at least a portion of said current path; a second device similar to said first device; a third device having a body of p-type semiconductive material, a source and a drain contacting the body of p-type material and defining the ends of a current path therethrough, and a gate spaced from said body of p-type material by an insulator and overlying at least a portion of said current path through the body of p-type material; a fourth device similar to said third device; negligible impedance means connecting the drains of the first and third devices together and to the gate of the second device; and negligible impedance means connecting the drains of the second and fourth devices together and to the gate of the first device.

24. The flip-flop as claimed in claim 23 including negligible impedance means connecting the gate of the third device to the gate of the first device, and negligible impedance means connecting the gate of the fourth device to the gate of the second device.

25. The flip-flop as claimed in claim 24 wherein the bodies of semiconductive material in the first and second devices are integral portions of a single body of n-type semiconductive material, and wherein the bodies of semiconductive material in the third and fourth devices are integral portions of a single body of p-type material.

26. The flip-flop as claimed in claim 24 wherein the sources of the first and second devices are connected to a first common point, the sources of the third and fourth devices are connected to a second common point, and means for connecting a source of operating potential across the first and second common points.

References Cited by the Examiner

UNITED STATES PATENTS

| | | | |
|---|---|---|---|
| 3,040,266 | 6/62 | Forman | 317—235 |
| 3,115,581 | 12/63 | Kilby | 307—88.5 |
| 3,134,912 | 5/64 | Evans | 307—88.5 |

OTHER REFERENCES

Electronics I, "Vacuum Deposited Circuits Use Field Effect," by Feldman et al., pages 80 to 82, April 12, 1963.

Electronic Design, "Field Effect Transistor Circuit Design," by Huang et al., October 1955, pages 42 to 45.

Electronics II, "Semiconductor Solid Circuits," by Kilby, August 7, 1959, pages 110–111.

International Solid State Circuits Conference, February 14, 1962, "Evaporated Circuits Incorporating a Thin Film Transistor," by Weimer, pages 32–33.

ARTHUR GAUSS, *Primary Examiner.*